(12) United States Patent
Li et al.

(10) Patent No.: US 12,260,806 B2
(45) Date of Patent: Mar. 25, 2025

(54) MICRO LIGHT-EMITTING DIODE DISPLAY PANEL

(71) Applicant: PlayNitride Display Co., Ltd., MiaoLi County (TW)

(72) Inventors: Yun-Li Li, MiaoLi County (TW); Yu-Chu Li, MiaoLi County (TW); Kuan-Yung Liao, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 500 days.

(21) Appl. No.: 17/673,808

(22) Filed: Feb. 17, 2022

(65) Prior Publication Data

US 2022/0172673 A1 Jun. 2, 2022

Related U.S. Application Data

(63) Continuation-in-part of application No. 16/988,717, filed on Aug. 10, 2020, now Pat. No. 11,289,012,
(Continued)

(30) Foreign Application Priority Data

Sep. 7, 2017 (TW) .................................. 106130555
Jul. 16, 2021 (TW) .................................. 110126175

(51) Int. Cl.
*G09G 3/32* (2016.01)
*H01L 25/16* (2023.01)
(52) U.S. Cl.
CPC ............. *G09G 3/32* (2013.01); *H01L 25/167* (2013.01); *G09G 2300/0452* (2013.01); *G09G 2320/041* (2013.01)

(58) Field of Classification Search
CPC ................................ G09G 3/32; H01L 25/167
See application file for complete search history.

(56) References Cited

U.S. PATENT DOCUMENTS

2008/0084365 A1  4/2008  Takahara et al.
2012/0139955 A1  6/2012  Jaffari et al.
(Continued)

FOREIGN PATENT DOCUMENTS

CN  101355833  1/2009
CN  106782308  5/2017
(Continued)

OTHER PUBLICATIONS

"Notice of allowance of China Counterpart Application", issued on May 18, 2023, p. 1-p. 4.
(Continued)

*Primary Examiner* — William A Harriston
(74) *Attorney, Agent, or Firm* — JCIPRNET (57) ABSTRACT

A micro light emitting diode display panel including a plurality of display units and a control element is provided. The plurality of display units are arranged in an array and each of the plurality of display units includes a first sub-pixel. The first sub-pixel includes a first micro light-emitting diode and a second micro light-emitting diode. The control element is configured to control light emission of the first micro light-emitting diode and the second micro light-emitting diode and determines operating currents of the first micro light-emitting diode and the second micro light-emitting diode. In a same display image, the operating current of the first micro light-emitting diode increases as an operating temperature of the first sub-pixel increases.

12 Claims, 6 Drawing Sheets

Related U.S. Application Data which is a continuation-in-part of application No. 16/121,634, filed on Sep. 5, 2018, now Pat. No. 10,777,123.

(56) References Cited

U.S. PATENT DOCUMENTS

| | | | |
|---|---|---|---|
| 2014/0159613 | A1 | 6/2014 | Chakravarti et al. |
| 2015/0362165 | A1 | 12/2015 | Chu et al. |
| 2017/0025075 | A1 | 1/2017 | Cok et al. |
| 2017/0061842 | A1* | 3/2017 | Cok .................... G09G 3/2003 |
| 2018/0047876 | A1 | 2/2018 | Chu et al. |
| 2018/0146521 | A1 | 5/2018 | Gong et al. |

FOREIGN PATENT DOCUMENTS

| | | |
|---|---|---|
| CN | 106910461 | 6/2017 |
| CN | 107946369 | 4/2018 |
| CN | 109445159 | 3/2019 |
| CN | 110416254 | 11/2019 |
| JP | 2011013551 | 1/2011 |
| TW | 200734997 | 9/2007 |
| TW | M579865 | 6/2019 |
| TW | 201944849 | 11/2019 |

OTHER PUBLICATIONS

Office Action of Taiwan Counterpart Application, issued on Jun. 15, 2022, pp. 1-3.
"Office Action of China Counterpart Application", issued on Sep. 27, 2022, p. 1-p. 8.

* cited by examiner

MICRO LIGHT-EMITTING DIODE DISPLAY PANEL

CROSS-REFERENCE TO RELATED APPLICATION

This application is a continuation-in-part application of and claims the priority benefit of a prior application Ser. No. 16/988,717, filed on Aug. 10, 2020, now allowed. The prior U.S. application Ser. No. 16/988,717 is a continuation-in-part application of and claims the priority benefit of a prior application Ser. No. 16/121,634, filed on Sep. 5, 2018, now patented, which claims the priority benefit of Taiwan application serial no. 106130555, filed on Sep. 7, 2017. This application also claims the priority benefit of Taiwan application serial no. 110126175, filed on Jul. 16, 2021. The entirety of each of the above-mentioned patent applications is hereby incorporated by reference herein and made a part of this specification.

BACKGROUND

Technical Field

The invention relates to a display panel, and particularly relates to a micro light-emitting diode display panel.

Description of Related Art

Along with evolution of optoelectronic technology, solid-state light sources (such as light-emitting diodes (LED)) have been widely used in various fields, such as road lighting, large outdoor billboards, traffic lights, etc. Recently, micro LED display panels have been developed, which use micro LEDs as sub-pixels in the display panel, so that each sub-pixel may be driven to emit light independently. The display panel that combines light beams independently emitted by these micro LEDs into an image is the micro LED display panel.

In the existing high-resolution or large-size micro LED display panels, since a current supply time allocated to each data line is very short, a current density transmitted by each data line needs to be increased, so that the data line is easily damaged by heat. In addition, as an operating temperature increases, the micro LEDs are liable to have problems of light-emitting efficiency reduction or wavelength shift, resulting in inconsistent brightness or color performance of the micro LED display panel.

SUMMARY

The invention is directed to a micro light-emitting diode display panel, which helps to mitigate a problem of brightness reduction or color shift during high-temperature operation.

An embodiment of the invention provides a micro light-emitting diode display panel including a plurality of display units and a control element. The plurality of display units are arranged in an array and each of the plurality of display units includes a first sub-pixel. The first sub-pixel includes a first micro light-emitting diode and a second micro light-emitting diode. The control element is configured to control light emission of the first micro light-emitting diode and the second micro light-emitting diode and determine operating currents of the first micro light-emitting diode and the second micro light-emitting diode. In a same display image, the operating current of the first micro light-emitting diode increases as an operating temperature of the first sub-pixel increases.

In an embodiment of the invention, an impedance of the first micro light-emitting diode is smaller than an impedance of the second micro light-emitting diode.

In an embodiment of the invention, the operating current of the first micro light-emitting diode is controlled and input by the control element.

In an embodiment of the invention, the operating current of the second micro light-emitting diode decreases as the operating temperature of the first sub-pixel increases.

In an embodiment of the invention, when the first sub-pixel is operated at a high temperature, the operating current of the first micro light-emitting diode is greater than the operating current of the second micro light-emitting diode. When the first sub-pixel is operated at a low temperature, the operating current of the second micro light-emitting diode is greater than the operating current of the first micro light-emitting diode.

In an embodiment of the invention, the micro light-emitting diode display panel further comprises a substrate. The control element and the first micro light-emitting diode and the second micro light-emitting diode in the display unit are bonded on the substrate.

In an embodiment of the invention, the micro light-emitting diode display panel further includes a plurality of micro ICs. The plurality of micro ICs are bonded on the substrate and each of the plurality of micro ICs is located among some of the plurality of display units and electrically connected to the some of the plurality of display units.

In an embodiment of the invention, the first micro light-emitting diode and the second micro light-emitting diode are different in at least one of the followings: an area of a current diffusion layer, a thickness of the current diffusion layer, a junction area of an electrode and an epitaxial layer, and a material of at least one of the electrode and the epitaxial layer.

In an embodiment of the invention, each of the display units further includes a second sub-pixel. The first sub-pixel and the second sub-pixel emit different colors, wherein the first micro light-emitting diode of the first sub-pixel has a shorter wavelength than the second micro light-emitting diode.

In an embodiment of the invention, the first sub-pixel further includes an impedance variable element. The impedance variable element is connected to the first micro light-emitting diode and the second micro light-emitting diode.

In an embodiment of the invention, in the first sub-pixel, the first micro light-emitting diode and the second micro light-emitting diode are connected in series, and the impedance variable element is connected in parallel with the first micro light-emitting diode.

In an embodiment of the invention, an impedance of the impedance variable element increases as the operating temperature of the first sub-pixel increases.

In an embodiment of the invention, the operating current of the first micro light-emitting diode increases as the operating temperature of the first sub-pixel increases.

In an embodiment of the invention, the first micro light-emitting diode has a shorter wavelength than the second micro light-emitting diode.

Based on the above description, in the embodiments of the invention, the first sub-pixel has two micro LEDs, and the operating current of at least one micro LED is controlled according to the operating temperature of the first sub-pixel to compensate for the problem of brightness reduction or color shift of the micro LED during a high-temperature operation, thereby enhancing the consistency of the brightness or color performance of the micro LED display panel.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Directional terminology mentioned in the following embodiments, such as "top," "bottom," "left," "right," "front," "back," etc., is used with reference to the orientation of the figure(s) being described and are not intended to limit the disclosure.

In the figures, each of the drawings depicts typical features of methods, structures, and/or materials used in the particular exemplary embodiments. However, these drawings are not to be interpreted as defining or limiting the scope or property covered by these exemplary embodiments. For example, for clarity's sake, relative thickness and position of each film layer, region and/or structure may be reduced or enlarged.

The terms "first" and "second" mentioned in this specification or the scope of the patent application are only used to name different elements or distinguish different embodiments or ranges, and are not used to limit an upper or lower limit of the number of elements, nor it is used to limit a manufacturing sequence or an arrangement sequence of the components. In addition, one element/film layer arranged on (or above) another element/film layer may cover a situation that the element/film layer is directly arranged on (or above) the another element/film layer, and the two elements/film layers directly contact; and a situation that the element/film layer is indirectly arranged on (or above) the another element/film layer, and one or a plurality of elements/film layers exist between the two elements/film layers.

Figure 1:
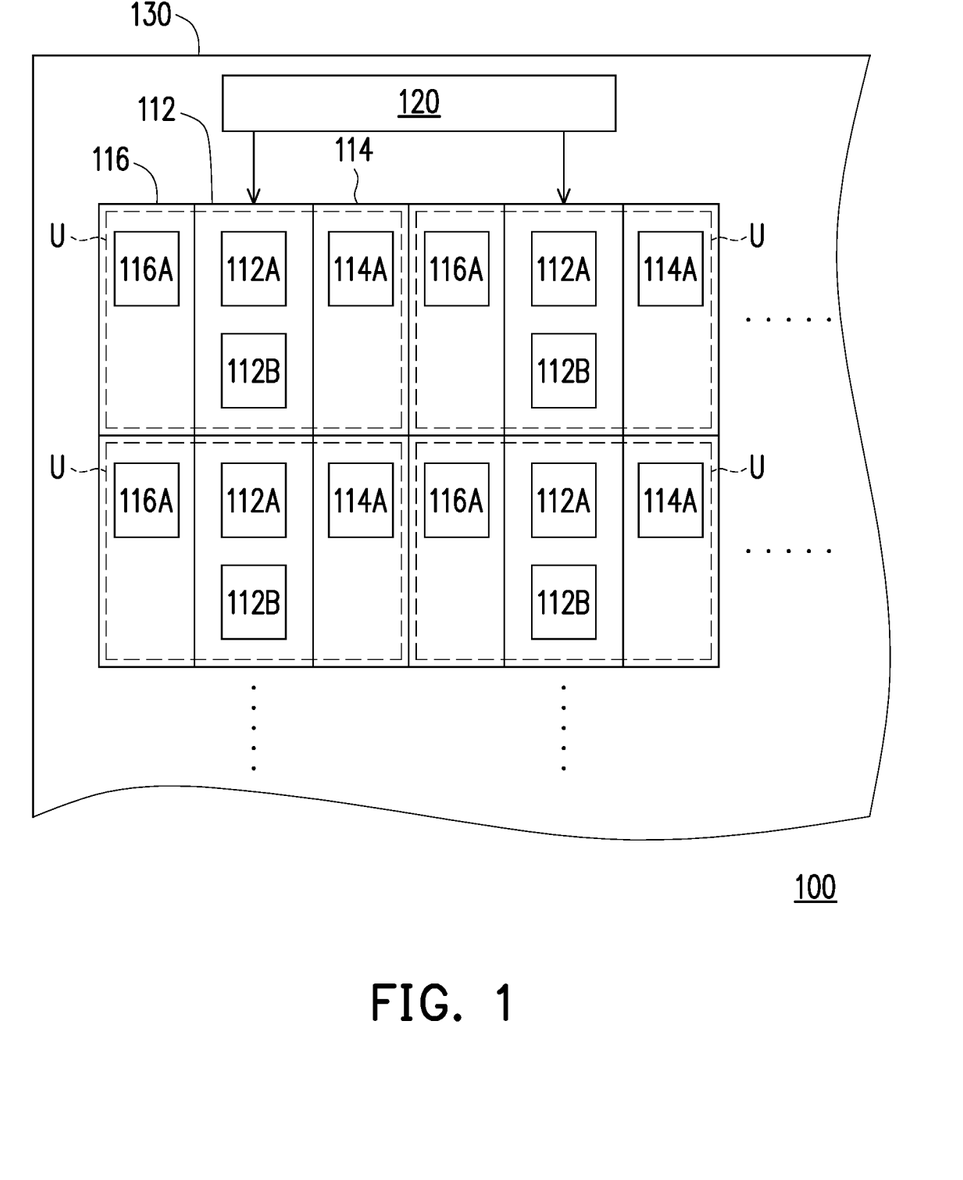
FIG. 1 is a schematic partial top view of a micro LED display panel according to an embodiment of the invention.
Figure 2:
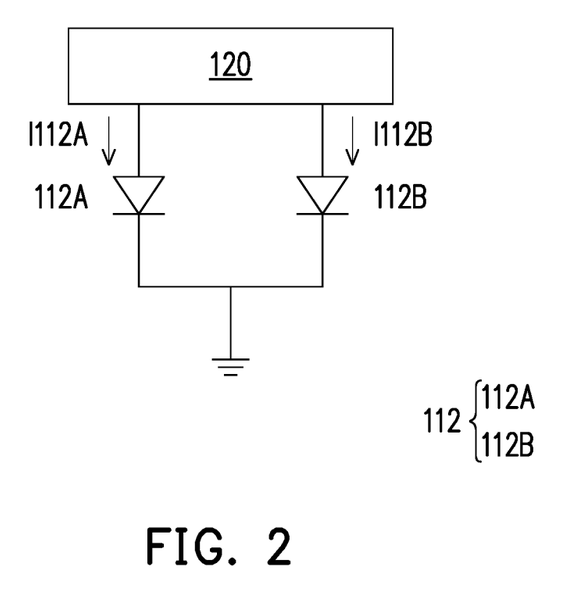
FIG. 2 is a first simple circuit diagram of a control element and a first sub-pixel in FIG. 1.
Figure 3A:
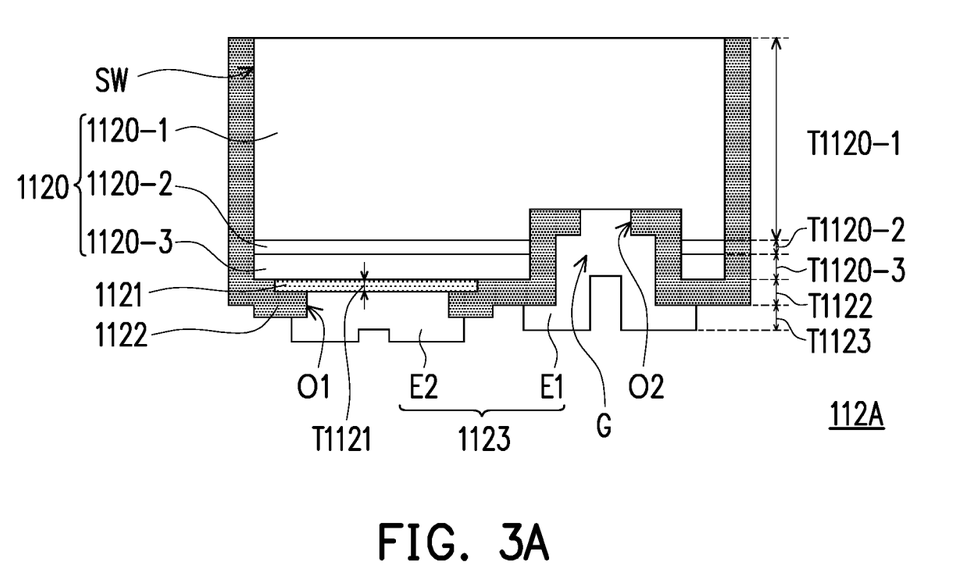
FIG. 3A and FIG. 3B are respectively schematic cross-sectional views of a first micro LED and a second micro LED in FIG. 2.
Figure 3B:
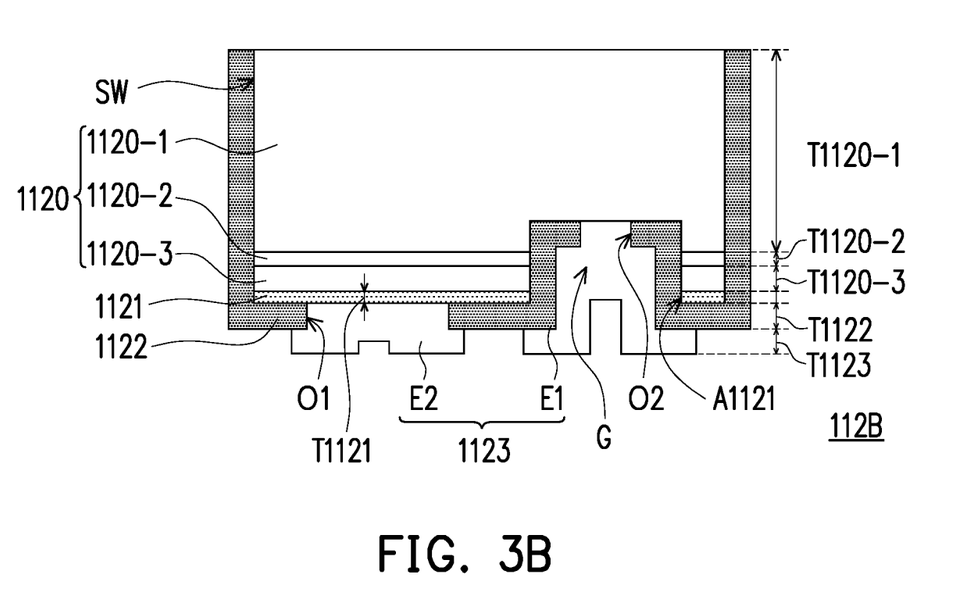
Figure 4:
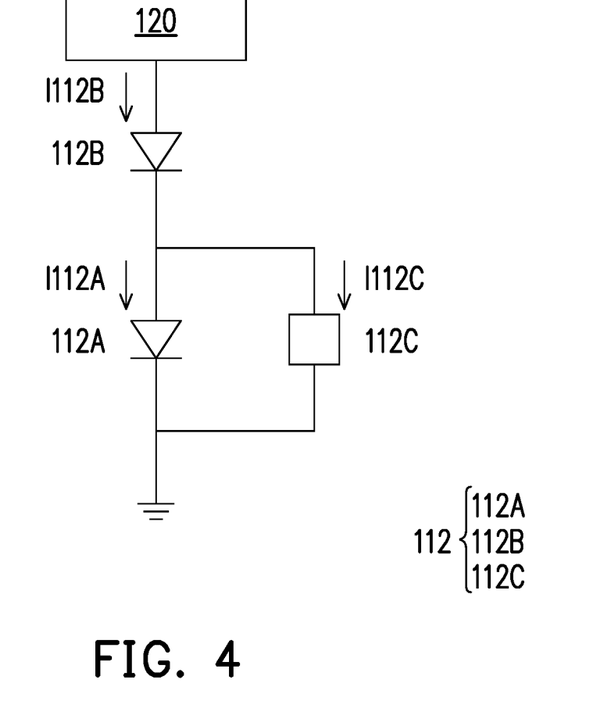
FIG. 4 is a second simple circuit diagram of the control element and the first sub-pixel in FIG. 1.
Figure 5:
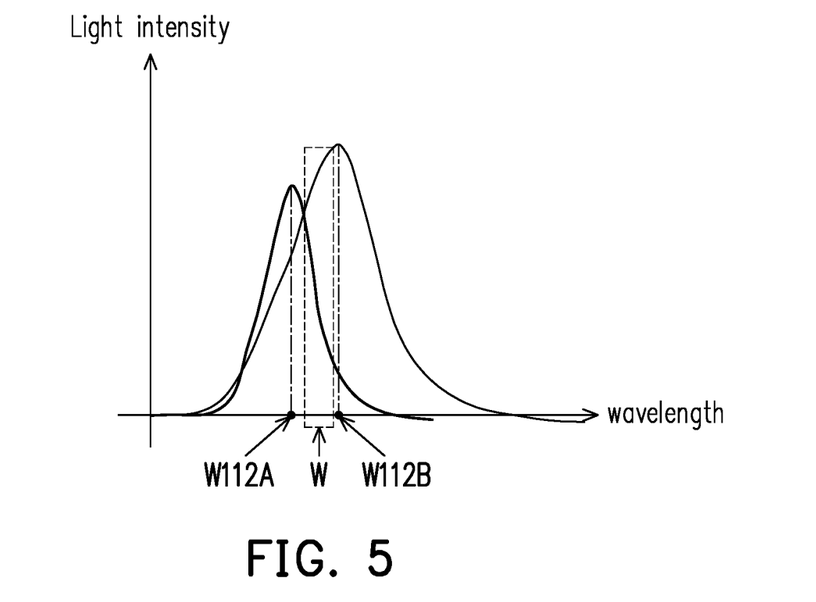
FIG. 5 is a schematic diagram of wavelengths and light intensities of the first micro LED and the second micro LED in the first sub-pixel of FIG. 2.
Figure 6:
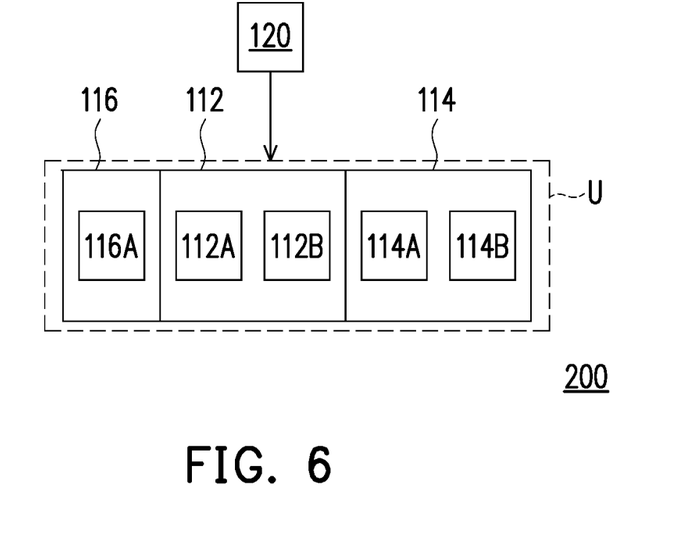
FIG. 6 to FIG. 8 are schematic partial top views of micro LED display panels according to other embodiments of the invention.
Figure 7:
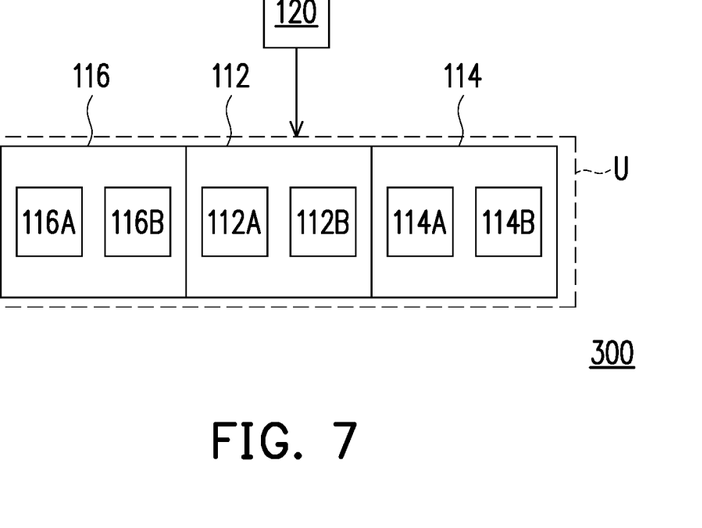
Figure 8:
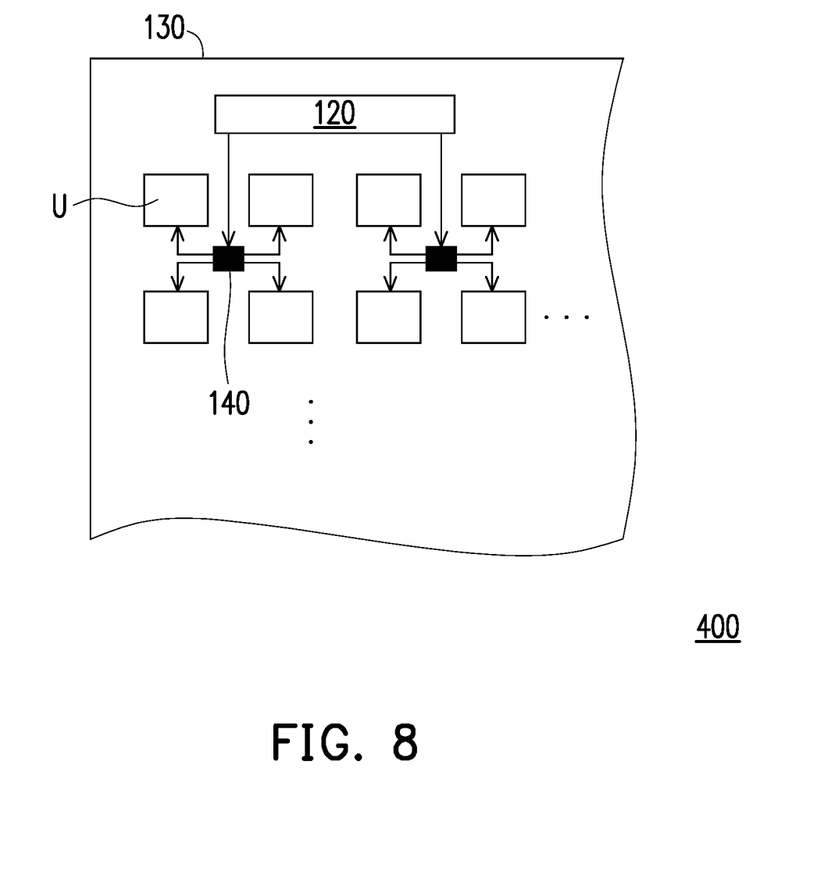

FIG. 1 is a schematic partial top view of a micro LED display panel according to an embodiment of the invention. FIG. 2 is a first simple circuit diagram of a control element and a first sub-pixel in FIG. 1. FIG. 3A and FIG. 3B are respectively schematic cross-sectional views of a first micro LED and a second micro LED in FIG. 2. FIG. 4 is a second simple circuit diagram of the control element and the first sub-pixel in FIG. 1. FIG. 5 is a schematic diagram of wavelength and light intensity of the first micro LED and the second micro LED in the first sub-pixel of FIG. 2. FIG. 6 to FIG. 8 are schematic partial top views of micro LED display panels according to other embodiments of the invention.

In FIG. 1 to FIG. 8, the same or similar elements may use the same or similar reference numerals, and descriptions thereof may be omitted. In addition, the features in the different exemplary embodiments may be combined with each other in case of no confliction, and the simple equivalent changes and modifications made in accordance with the scope of the specification or the claims are still within the scope of the patent.

Referring to FIG. 1, a micro LED display panel 100 may include a plurality of display units U, and each display unit U is composed of a first sub-pixel 112, a second sub-pixel 114, and a third sub-pixel 116. The plurality of display units U are arranged in an array to enable the micro LED display panel 100 to display images (only four display units U are schematically shown in FIG. 1). The first sub-pixel 112 may include a plurality of micro LEDs. FIG. 1 schematically shows that the first sub-pixel 112 includes a micro LED 112A (which is also referred to as a first micro LED) and a micro LED 112B (which is also referred to as a second micro LED) with the same color of the micro LED 112A. However, the number of the micro LEDs in the first sub-pixel 112 is not limited thereto. In some embodiments, the plurality of micro LEDs may have a same size to facilitate a bonding process and circuit design, but the invention is not limited thereto.

In some embodiments, as shown in FIG. 2, the micro LED 112A and the micro LED 112B may be electrically independent from each other. For example, the micro LED display panel 100 may further include a control element 120. The control element 120 is used for controlling light emission of the micro LED 112A and the micro LED 112B and determining operating currents of the micro LED 112A and the micro LED 112B. To be specific, the control element 120 may control a light-emitting state (lighting, non-lighting, or a light-emitting intensity) of the micro LEDs, wherein the micro LED 112A and the micro LED 112B may be independently electrically connected to the control element 120, so that the control element 120 may individually control a current Il 12A input to the micro LED 112A and a current Il 12B input to the micro LED 112B. The control element 120 may be a circuit chip or a driver of a micro LED, but the invention is not limited thereto.

In some embodiments, as shown in FIG. 1, the control element 120 may be arranged on one side of the micro LED display panel 100, and connected to each sub-pixel through wires (not shown), so as to individually control the currents input to the micro LEDs of each sub-pixel. However, in other embodiments, the micro LED display panel 100 may include a plurality of control elements 120, and the plurality of control elements 120 may be correspondingly arranged in the individual sub-pixels.

In some embodiments, the micro LED 112A and the micro LED 112B may have a same or closed light-emitting wavelength. The light-emitting wavelength refers to a wavelength corresponding to the maximum light intensity in a spectrum of the micro LED. The plurality of micro LEDs having closed light-emitting wavelengths refers to that a difference of the light-emitting wavelengths of the plurality of micro LEDs does not exceed 10 nm, for example, falls within a range of 1 nm to 10 nm, and preferably falls within a range of 3 nm to 5 nm, but the invention is not limited thereto.

In the first sub-pixel 112, the operating current of at least one micro LED changes as an operating temperature of the first sub-pixel 112 changes. To be specific, the operating current of at least one micro LED (such as the micro LED 112A or the micro LED 112B) is controlled according to the operating temperature of the first sub-pixel 112 to compensate for the problem of brightness reduction or color shift of the micro LED during a high-temperature operation, so as to enhance the consistency of brightness or color performance of the micro LED display panel 100.

For example, under a framework of FIG. 2, the micro LED 112A and the micro LED 112B may have different impedances. During the high-temperature operation, the micro LED with a smaller impedance may have a greater operating current, while during a low-temperature or normal temperature operation, the micro LED with a larger impedance may have a greater operating current. A method for making the micro LED 112A and the micro LED 112B to have different impedances may include making the micro LED 112A and the micro LED 112B to be different in at least one of the followings: an area of a current diffusion layer, a thickness of the current diffusion layer, a junction area of an electrode and an epitaxial layer, and a material of at least one of the electrode and the epitaxial layer.

Take the example that the impedance of the micro LED 112A is smaller than the impedance of the micro LED 112B, the micro LED 112A may have a smaller area of the current diffusion layer, a smaller thickness of the current diffusion layer, or a smaller junction area of the electrode and the epitaxial layer compared to the micro LED 112B, or the material of at least one of the electrode and the epitaxial layer may be adjusted so that the impedance of the micro LED 112A is smaller than the impedance of the micro LED 112B.

FIG. 3A and FIG. 3B schematically illustrate that an area of a current diffusion layer is adjusted so that the impedance of the micro LED 112A is smaller than the impedance of the micro LED 112B. As shown in FIG. 3A and FIG. 3B, each of the micro LED 112A and the micro LED 112B may, for example, include an epitaxial layer 1120, a current diffusion layer 1121, and an electrode layer 1123.

The epitaxial layer 1120 may include an n-type semiconductor layer (such as n-GaN or the like) 1120-1, a multiple-quantum well (MQW) layer 1120-2, and a p-type semiconductor layer (such as p-GaN or the like) 1120-3, wherein the MQW layer 1120-2 is located between the n-type semiconductor layer 1120-1 and the p-type semiconductor layer 1120-3, and the p-type semiconductor layer 1120-3 is located between the MQW layer 1120-2 and the current diffusion layer 1121. In some embodiments, a thickness T1120-1 of the n-type semiconductor layer 1120-1 is 3000 nm, a thickness T1120-2 of the MQW layer 1120-2 is 300 nm, a thickness T1120-3 of the p-type semiconductor layer 1120-3 is 600 nm, and a thickness of the epitaxial layer 1120 (i.e., a sum of the thickness T1120-1, the thickness T1120-2, and the thickness T1120-3) is 4 μm to 5 μm, but the invention is not limited thereto.

The current diffusion layer 1121 is disposed on the epitaxial layer 1120. In some embodiments, the current diffusion layer 1121 is a metal oxide layer (such as an ITO layer or the like), and a thickness T1121 of the current diffusion layer 1121 is 100 nm, but the invention is not limited thereto.

The larger the area of the current diffusion layer 1121 is, the smaller a current density is and the larger the impedance is. Therefore, by making the area of the current diffusion layer 1121 of the micro LED 112A to be smaller than the area of the current diffusion layer 1121 of the micro LED 112B, the micro LED 112A may have smaller impedance than that of the micro LED 112B. The area of the current diffusion layer 1121 refers to an area of an orthogonal projection of the current diffusion layer 1121 on the n-type semiconductor layer 1120-1.

In some embodiments, an area ratio of the current diffusion layer 1121 of the micro LED 112B to the current diffusion layer 1121 of the micro LED 112A may fall within a range of 1.2 to 2. For example, the area of the current diffusion layer 1121 of the micro LED 112A is 10 μm² to 30 μm² (approximately less than 15 μm²), and the area of the current diffusion layer 1121 of the micro LED 112B is 30 μm² to 100 μm², but the invention is not limited thereto.

The electrode layer 1123 is disposed on the current diffusion layer 1121. In some embodiments, the electrode layer 1123 is a metal layer (such as a copper layer or the like), and a thickness T1123 of the electrode layer 1123 is 2 nm, but the invention is not limited thereto.

In some embodiments, each of the micro LED 112A and the micro LED 112B may, for example, further include an insulating layer 1122. The insulating layer 1122 covers the current diffusion layer 1121 and the epitaxial layer 1120 (for example, the insulating layer 1122 covers a sidewall SW of the epitaxial layer 1120). A material of the insulating layer 1122 may include silicon oxide, silicon nitride or the like, and a thickness T1122 of the insulating layer 1122 may be 700 nm, but the invention is not limited thereto.

The insulating layer 1122 may have an opening O1 exposing the current diffusion layer 1121 and an opening O2 exposing the epitaxial layer 1120. The electrode layer 1123 may have a first electrode E1 that is in contact with the epitaxial layer 1120 through the opening O2 and a second electrode E2 that is in contact with the current diffusion layer 1121 through the opening O1, and the first electrode E1 and the second electrode E2 are electrically insulated from each other. In the micro LED 112A, the current diffusion layer 1121 is overlapped with the second electrode E2 and larger than the opening O1. In the micro LED 112B, the current diffusion layer 1121 covers the epitaxial layer 1120, and an aperture A1121 of the current diffusion layer 1121 exposes a groove G of the epitaxial layer 1120.

It should be understood that FIG. 3A and FIG. 3B only schematically illustrate a structure of a micro LED, but the structures or the number of layers of the micro LED 112A and the micro LED 112B, and/or a shape or a size of each layer, each opening or each aperture may be changed according to actual needs. The micro LED 112A and the micro LED 112B of the invention are intended to include any known form of the micro LED.

Referring to FIG. 2, in the first sub-pixel 112, the operating current of the micro LED 112A (the micro LED with a smaller impedance) may increase as an operating temperature of the first sub-pixel 112 increases, and the operating current of the micro LED 112B (the micro LED with a larger impedance) may decrease as the operating temperature of the first sub-pixel 112 increases. In other words, the operating current of the micro LED 112A during the high temperature operation is greater than the operating current of the micro LED 112A during a normal temperature operation, and the operating current of the micro LED 112B during the normal temperature operation is greater than the operating current of the micro LED 112B during the high temperature operation.

In some embodiments, when the first sub-pixel 112 is operated at a high temperature, the operating current of the micro LED 112A (the micro LED with a smaller impedance)

may be greater than the operating current of the micro LED 112B (the micro LED with a larger impedance). On the other hand, when the first sub-pixel 112 is operated at a low temperature, the operating current of the micro LED 112B may be greater than the operating current of the micro LED 112A. To be specific, when operating at a low or normal temperature, the micro LED with larger impedance (such as the micro LED 112B) may have a larger operating current to maintain a required brightness; while when operating at a high temperature, since both of the micro LED 112A and the micro LED 112B have a problem of high-temperature light attenuation (i.e., the brightness of the micro LED 112A and the brightness of the micro LED 112B are both reduced), at this time, the micro LED with a smaller impedance (such as the micro LED 112A) may be made to have a larger operating current (for example, to increase the operating current of the low-impedance micro LED), so as to enhance a brightness through a high current density, and thereby maintaining a uniform brightness under different operating temperatures. It should be understood that at any operating temperature, the micro LED 112A and the micro LED 112B may be one turned on and one turned off or both turned on. Based on considerations of safety or service life, etc., the micro LED may be turned off or the operating current of the micro LED may be reduced when the operating temperature of the micro LED is too high.

In this specification, the high temperature in high-temperature operation refers to a temperature at which brightness or service life of the micro LED is significantly reduced, which is usually above 60 degrees Celsius, but the invention is not limited thereto. The normal temperature in the normal temperature operation refers to a typical working temperature of the micro LED, which is usually 25 degrees Celsius, but the invention is not limited thereto. The operating current of the micro LED refers to a current flowing through the micro LED. The operating temperature of the first sub-pixel refers to a temperature of a region where the first sub-pixel is located.

In some embodiments, a temperature sensor (not shown) may be used to measure a temperature of a single sub-pixel or a single display unit in the micro LED display panel, or to measure a temperature of a region containing a plurality of sub-pixels or a plurality of display units. In some other embodiments, by using the operating current of the micro LED in the sub-pixel to deduce back the operating temperature of the sub-pixel, the temperature sensor may be omitted. In some other embodiments, under a framework of driving the micro LEDs by means of pulse-width modulation (PWM), by using an operating time of the micro LED in the sub-pixel to deduce back the operating temperature of the sub-pixel, the temperature sensor may be omitted. In some other embodiments, by using a voltage drop caused by increase of the operating temperature at both ends of the micro LED to deduce back the operating temperature of the sub-pixel, the temperature sensor may be omitted. By using the above methods to obtain the operating temperature of the sub-pixel, and feed back such information to the control element, it avails the control element to perform corresponding treatment (for example, to change the operating current or operating time of the micro LED based on the operating temperature of the sub-pixel).

In some embodiments, a light sensor (not shown) may be used to measure a brightness or a light-emitting wavelength of a single sub-pixel or a single display unit in the micro LED display panel, or measure a brightness or a light-emitting wavelength of a region containing a plurality of sub-pixels or a plurality of display units to serve as a reference for the control element to determine whether to perform the corresponding treatment, or to confirm effectiveness of adjustment after the control element adjusts a light-emitting state of the micro LED. For example, the brightness or light-emitting wavelength measured by the light sensor may be compared with a predetermined brightness or a predetermined light-emitting wavelength to determine whether it is required to adjust the light-emitting state of the micro LED. For example, when the brightness or light-emitting wavelength of the micro LED varies, the information related to the variation may be fed back to the control element, and the control element may perform corresponding treatment. After the control element performs the corresponding treatment, the light sensor may be used to measure the adjusted brightness or light-emitting wavelength to determine whether the adjustment is effective or appropriate. If the adjustment effectively adjusts the brightness or the light-emitting wavelength back to an acceptable range, further adjustment may be omitted. If the adjustment does not adjust the brightness or the light-emitting wavelength back to the acceptable range, one or more adjustments may be performed until the brightness or the light-emitting wavelength is adjusted back to the acceptable range. If the brightness or light-emitting wavelength cannot be adjusted back to the acceptable range after multiple adjustments, or when an operating parameter to be adjusted exceeds an operable range (for example, the operating current to be adjusted exceeds the maximum current that the micro LED can withstand), the adjustment is terminated.

In some embodiments, as shown in FIG. 1, in addition to the first sub-pixel 112, the micro LED display panel 100 may further include a second sub-pixel 114 and a third sub-pixel 116. The second sub-pixel 114 has, for example, one micro LED (such as a micro LED 114A), and the third sub-pixel 116 has, for example, one micro LED (such as a micro LED 116A), but the invention is not limited thereto. The control element 120 is further electrically connected to the micro LED 114A in the second sub-pixel 114 and the micro LED 116A in the third sub pixel 116 to control the light-emitting states of the micro LED 114A and the micro LED 116A.

In some embodiments, the first sub-pixel 112, the second sub-pixel 114, and the third sub-pixel 116 are sub-pixels of different colors. In this way, the micro LED display panel 100 may perform full-color display. For example, the first sub-pixel 112, the second sub-pixel 114, and the third sub-pixel 116 may be respectively a red sub-pixel, a green sub-pixel, and a blue sub-pixel. In other words, the micro LED 112A and the micro LED 112B are red micro LEDs, the micro LED 114A is a green micro LED, and the micro LED 116A is a blue micro LED.

Since high-temperature light attenuation of red light is more significant than that of green light or blue light, by configuring two red micro LEDs with different impedances in the red sub-pixel, and an input current of at least one of the two red micro LEDs is changed based on the operating temperature in accordance with the embodiment, the consistency of the light intensity of the red light is maintained at different operating temperatures, so that the micro LED display panel 100 may have good display quality.

It should be understood that although the above method or structure for mitigating the light attenuation problem is introduced while taking the red sub-pixel as an example for description, the invention is not limited thereto. In other embodiments, the above method or structure for mitigating the light attenuation problem may also be applied to sub-pixels of other colors. In addition, the sub-pixels of one or more colors in the micro LED display panel 100 may all adopt the above-mentioned method or structure for mitigating the light attenuation problem.

In addition, although FIG. 1 illustrates that four display units U are electrically connected to one control element 120, i.e., the four display units U share one control element 120, but the invention is not limited thereto. In another embodiment, one display unit U may be connected to one control element 120.

In some embodiments, as shown in FIG. 1, the micro LED display panel 100 may further include a substrate 130. The control element 120 and the micro LEDs in the display unit U may be jointly bonded on the substrate 130. For example, the substrate 130 may be a printed circuit board (PCB), a flexible printed circuit board (PFBC), a glass carrier board with circuits, or a ceramic substrate with circuits, but the invention is not limited thereto.

In the above embodiment, a situation that the micro LED 112A and the micro LED 112B have different impedances, and the control element 120 individually controls the operating currents of the micro LED 112A and the micro LED 112B is taken as an example for description, but the disclosure is not limited thereto. Under a framework of FIG. 4, the micro LED 112A and the micro LED 112B may have a same impedance, and the micro LED 112A and the micro LED 112B are arranged in series. To be specific, the micro LED 112B is electrically connected between the control element 120 and the micro LED 112A, and the first sub-pixel 112 further includes an impedance variable element 112C. The impedance variable element 112C is connected in parallel with the micro LED 112A, wherein an impedance of the impedance variable element 112C increases as the operating temperature of the first sub-pixel 112 increases.

According to FIG. 4, the current I112B flowing through the micro LED 112B is equal to a sum of the current I112A flowing through the micro LED 112A and a current I112C flowing through the impedance variable element 112C. Under a constant current operation (i.e., the current I112B maintains a constant value), the current I112C flowing through the impedance variable element 112C decreases as the impedance of the impedance variable element 112C increases, and the current I112A flowing through the micro LED 112A increases. In other words, the current I112A flowing through the micro LED 112A increases as the operating temperature of the first sub-pixel 112 increases. Under the constant current operation, when the first sub-pixel 112 is at a high temperature, the brightness of both of the micro LED 112A and the micro LED 112B decreases, at this time, by increasing the impedance of the impedance variable element 112C, the current I112A flowing through the micro LED 112A is increased to increase the brightness of the micro LED 112A, thereby compensating for the problem of brightness reduction of the micro LED during the high-temperature operation, and improving consistency in brightness performance of the micro LED display panel.

Although the embodiments of FIG. 2 and FIG. 4 are described by taking the micro LED 112A and the micro LED 112B having the same wavelength as an example, the disclosure is not limited thereto. Under the frameworks of FIG. 2 and FIG. 4, the micro LED 112A may have a shorter wavelength than the micro LED 112B. As shown in FIG. 5, a frequency spectrum of the micro LED 112B and a frequency spectrum of the micro LED 112A may be partially overlapped, and a light-emitting wavelength W112B of the micro LED 112B is greater than a light-emitting wavelength W112A of the micro LED 112A. In some embodiments, a difference between the light-emitting wavelength W112A of the micro LED 112A and the light emitting-wavelength W112B of the micro LED 112B falls within a range of 1 nm to 10 nm, and preferably falls within a range of 3 nm to 5 nm.

In the first sub-pixel 112, by changing an input current ratio of the micro LEDs with different light-emitting wavelengths, a centroid wavelength W may be controlled, and a current density required by each micro LED may be reduced. Since the smaller a change amount of the current density is, the smaller a shift amount of the centroid wavelength is, to replace a single micro LED with multiple micro LEDs helps reducing a color shift amount of each micro LED. In this way, the consistency of the centroid wavelength and the light intensity may be maintained under different gray scales. In some embodiments, the control element 120 controls the current density of the micro LED 112A and the micro LED 112B to be respectively less than 3 A/cm$^2$, which may significantly mitigate the color shift problem.

Moreover, when the micro LED is operated at a high temperature, the light-emitting wavelength is liable to shift toward a longer wavelength, and the greater the operating current of the micro LED is, the more the light-emitting wavelength shifts toward a shorter wavelength. Therefore, during the high-temperature operation, to make the short-wavelength micro LED (such as the micro LED 112A) to have a larger operating current (or a larger current density) helps to compensate for the color shift phenomenon caused by wavelength shift.

Since human eyes are most sensitive to green light (which looks brighter under a same brightness) among red light, green light and blue light, a color shift problem (a blue shift phenomenon) of the green micro LED is more significant. In the embodiment, by configuring two green micro LEDs with different light-emitting wavelengths in the green sub-pixel, and an input current of at least one of the two green micro LEDs is changed based on the operating temperature, the consistency of the centroid wavelength and the light intensity of the green light are maintained at different operating temperatures, so that the micro LED display panel may have good display quality.

It should be understood that although the above method or structure for mitigating the light attenuation problem and the color shift problem is introduced while taking the green sub-pixel as an example for description, the invention is not limited thereto. In other embodiments, the above method or structure for mitigating the light attenuation problem and the color shift problem may also be applied to sub-pixels of other colors. In addition, the sub-pixels of one or more colors in the micro LED display panel may all adopt the above-mentioned method or structure for mitigating the light attenuation problem.

As shown in FIG. 6, in a micro LED display panel 200, the above-mentioned method for mitigating the light attenuation and/or color shift problem may be further applied to the second sub-pixel 114. To be specific, in the micro LED display panel 200, the second sub-pixel 114 (for example, a green sub-pixel) includes a micro LED 114A and a micro LED 114B. The micro LED 114A and the micro LED 114B may have a same size to facilitate a bonding process and circuit design, but the invention is not limited thereto. The design of the micro LED 114A and the micro LED 114B may refer to the description of FIG. 2, FIG. 4, or FIG. 5, and details thereof are not repeated.

As shown in FIG. 7, in a micro LED display panel 300, the above-mentioned method for mitigating the light attenuation and/or color shift problem may be further applied to the third sub-pixel 116. To be specific, in the micro LED display panel 300, the third sub-pixel 116 (for example, a blue sub-pixel) includes a micro LED 116A and a micro LED 116B. The micro LED 116A and the micro LED 116B may have a same size to facilitate the bonding process and circuit design, but the invention is not limited thereto. The design of the micro LED 116A and the micro LED 116B may refer to the description of FIG. 2, FIG. 4, or FIG. 5, and details thereof are not repeated.

Referring to FIG. 8, a micro LED display panel 400 is similar to the micro LED display panel 100 of FIG. 1, except that the micro LED display panel 400 further includes a plurality of micro ICs 140. The plurality of micro ICs 140 are bonded on the substrate 130, and each micro IC 140 is located among a number of (such as four, but the invention is not limited thereto) display units U and is electrically connected to the number of display units U in order to control the number of micro LEDs located in the plurality of display units U. In some embodiments, a thickness ratio of the micro IC 140 to the micro LED may fall within a range of 0.8 to 1.2, but the invention is not limited thereto. In some embodiments, a thickness of the micro IC 140 is 5 μm to 10 μm, and a thickness of the micro LED is 5 μm to 10 μm, but the invention is not limited thereto. The above-mentioned small size (such as thickness) design helps a transfer process or the display quality.

In summary, in the embodiments of the invention, the first sub-pixel has two micro LEDs, and the operating current of at least one micro LED is controlled according to the operating temperature of the first sub-pixel to compensate for the problem of brightness reduction or color shift of the micro LED during a high-temperature operation, thereby enhancing the consistency of the brightness or color performance of the micro LED display panel.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A micro light-emitting diode display panel, comprising:
    a plurality of display units arranged in an array and each of the plurality of display units comprising a first sub-pixel, wherein the first sub-pixel comprises a first micro light-emitting diode and a second micro light-emitting diode with the same color of the first micro light-emitting diode; and
    a control element configured to control light emission of the first micro light-emitting diode and the second micro light-emitting diode and determine operating currents of the first micro light-emitting diode and the second micro light-emitting diode,
    wherein in a same display image, the operating current of the first micro light-emitting diode increases as an operating temperature of the first sub-pixel increases, and
    wherein an impedance of the first micro light-emitting diode is smaller than an impedance of the second micro light-emitting diode.

2. The micro light-emitting diode display panel as claimed in claim 1, wherein the operating current of the first micro light-emitting diode is controlled and input by the control element.

3. The micro light-emitting diode display panel as claimed in claim 2, wherein the operating current of the second micro light-emitting diode decreases as the operating temperature of the first sub-pixel increases.

4. The micro light-emitting diode display panel as claimed in claim 2, wherein when the first sub-pixel is operated at a high temperature, the operating current of the first micro light-emitting diode is greater than the operating current of the second micro light-emitting diode, and when the first sub-pixel is operated at a low temperature, the operating current of the second micro light-emitting diode is greater than the operating current of the first micro light-emitting diode.

5. The micro light-emitting diode display panel as claimed in claim 1, further comprising:
    a substrate, wherein the control element and the first micro light-emitting diode and the second micro light-emitting diode in the display unit are bonded on the substrate.

6. The micro light-emitting diode display panel as claimed in claim 5, further comprising:
    a plurality of micro ICs bonded on the substrate, wherein each of the plurality of micro ICs are located among some of the plurality of display units and electrically connected to the some of the plurality of display units.

7. The micro light-emitting diode display panel as claimed in claim 1, wherein the first micro light-emitting diode and the second micro light-emitting diode are different in at least one of the followings:
    an area of a current diffusion layer;
    a thickness of the current diffusion layer;
    a junction area of an electrode and an epitaxial layer; and
    a material of at least one of the electrode and the epitaxial layer.

8. The micro light-emitting diode display panel as claimed in claim 1, wherein each of the display units further comprises a second sub-pixel, the first sub-pixel and the second sub-pixel emit different colors, wherein the first micro light-emitting diode of the first sub-pixel has a shorter wavelength than the second micro light-emitting diode.

9. A micro light-emitting diode display panel, comprising:
    a plurality of display units arranged in an array and each of the plurality of display units comprising a first sub-pixel, wherein the first sub-pixel comprises a first micro light-emitting diode and a second micro light-emitting diode with the same color of the first micro light-emitting diode; and
    a control element configured to control light emission of the first micro light-emitting diode and the second micro light-emitting diode and determine operating currents of the first micro light-emitting diode and the second micro light-emitting diode,
    wherein in a same display image, the operating current of the first micro light-emitting diode increases as an operating temperature of the first sub-pixel increases, and
    wherein the first sub-pixel further comprises an impedance variable element, the impedance variable element is connected to the first micro light-emitting diode and the second micro light-emitting diode.

10. The micro light-emitting diode display panel as claimed in claim 9, wherein in the first sub-pixel, the first micro light-emitting diode and the second micro light-emitting diode are connected in series, and the impedance variable element is connected in parallel with the first micro light-emitting diode.

11. The micro light-emitting diode display panel as claimed in claim 10, wherein an impedance of the impedance variable element increases as the operating temperature of the first sub-pixel increases.

12. The micro light-emitting diode display panel as claimed in claim 10, wherein the first micro light-emitting diode has a shorter wavelength than the second micro light-emitting diode.

\* \* \* \* \*